US007214554B2

(12) United States Patent
Winters et al.

(10) Patent No.: US 7,214,554 B2
(45) Date of Patent: May 8, 2007

(54) MONITORING THE DEPOSITION PROPERTIES OF AN OLED

(75) Inventors: Dustin L. Winters, Webster, NY (US); Michele L. Ricks, Rochester, NY (US); Nancy J. Armstrong, Webster, NY (US); Robert S. Cupello, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 293 days.

(21) Appl. No.: 10/803,761

(22) Filed: Mar. 18, 2004

(65) Prior Publication Data

US 2005/0208698 A1 Sep. 22, 2005

(51) Int. Cl.
*H01L 21/00* (2006.01)

(52) U.S. Cl. .......................... 438/21; 438/99; 438/149; 438/151; 257/E21.413; 257/E21.122

(58) Field of Classification Search ................. 438/99, 438/21, 14, 26, 28, 29, 781, 149, 151; 257/E21.007, 257/E21.242, E21.352, E21.122, E21.413
See application file for complete search history.

(56) References Cited

U.S. PATENT DOCUMENTS 4,356,429 A 10/1982 Tang
4,858,556 A * 8/1989 Siebert ....................... 118/664
5,276,380 A 1/1994 Tang
5,550,066 A 8/1996 Tang et al.
5,904,961 A * 5/1999 Tang et al. ................. 427/561
6,281,634 B1 8/2001 Yokoyama
6,313,905 B1 * 11/2001 Brugger et al. ............... 355/55
6,384,529 B2 * 5/2002 Tang et al. ................. 313/506
6,417,034 B2 * 7/2002 Kitazume et al. ........... 438/160
6,456,013 B1 9/2002 Komiya et al.
6,513,451 B2 * 2/2003 Van Slyke et al. .... 118/723 VE
6,547,939 B2 * 4/2003 Hsueh et al. .......... 204/298.03
6,661,581 B1 * 12/2003 Sankur ....................... 359/653
6,716,656 B2 * 4/2004 Shtein et al. ................. 438/24
6,858,454 B1 * 2/2005 Kanzawa et al. ............. 438/16
6,943,066 B2 * 9/2005 Brody et al. ................ 438/149
2002/0139666 A1 * 10/2002 Hsueh et al. .......... 204/298.03
2003/0168013 A1 * 9/2003 Freeman et al. ............ 118/726
2004/0131300 A1 * 7/2004 Atanasov ..................... 385/12
2005/0048862 A1 * 3/2005 Phelan et al. ................. 445/24

FOREIGN PATENT DOCUMENTS

| | | |
|---|---|---|
| EP | 1348945 | 10/2003 |
| WO | 03/020999 | 3/2003 |
| WO | 03/034471 | 4/2003 |
| WO | 2005/006458 | 1/2005 |

OTHER PUBLICATIONS

Patent abstracts of Japan, vol. 014, No. 308 (E-0947), Jul. 3, 1990 & JP 02 098955 A; Mitsubishi Electric Corp.; Apr. 11, 1990.

* cited by examiner

*Primary Examiner*—Bradley Baumeister
*Assistant Examiner*—Igwe U. Anya
(74) *Attorney, Agent, or Firm*—Raymond L. Owens

(57) ABSTRACT

A method for making an OLED device includes providing a substrate having one or more test regions and one or more device regions, moving the substrate into a least one deposition chamber for deposition of at least one organic layer, and depositing the at least one organic layer through a shadowmask selectively onto the at least one device region and at least one test region on the substrate. The method also includes measuring a property of the at least one organic layer in the at least one test region, and adjusting the deposition process in accordance with the measured property.

10 Claims, 4 Drawing Sheets

MONITORING THE DEPOSITION PROPERTIES OF AN OLED

FIELD OF THE INVENTION

The present invention relates generally to monitoring and controlling the formation of organic layers deposited in making organic light-emitting devices.

BACKGROUND OF THE INVENTION

Full color organic electroluminescent (EL), also known as organic light-emitting devices (OLED), have recently been demonstrated as a new type of flat panel display. In simplest form, an organic EL device is comprised of an electrode serving as the anode for hole injection, an electrode serving as the cathode for electron injection, and an organic EL medium sandwiched between these electrodes to support charge recombination that yields emission of light. An example of an organic EL device is described in U.S. Pat. No. 4,356,429. In order to construct a pixilated display device such as is useful, for example, as a television, computer monitor, cell phone display or digital camera display, individual organic EL elements can be arranged as an array of pixels in a matrix pattern. To produce a multi-color display, the pixels are further arranged into subpixels, with each subpixel emitting a different color. This matrix of pixels can be electrically driven using either a simple passive matrix or an active matrix driving scheme. In a passive matrix, the organic EL layers are sandwiched between two sets of orthogonal electrodes arranged in rows and columns. An example of a passive matrix driven organic EL device is disclosed in U.S. Pat. No. 5,276,380. In an active matrix configuration, each pixel is driven by multiple circuit elements such as transistors, capacitors, and signal lines. Examples of such active matrix organic EL devices are provided in U.S. Pat. Nos. 5,550,066, 6,281,634, and 6,456,013.

In an OLED device, the deposition of the organic layers must be accurately controlled in order to achieve the desired properties of the OLED device such as operating voltage, efficiency, and color. One control technique commonly used for OLED devices that are deposited by evaporation is the use of crystal mass sensor device (also referred to as a quartz oscillator) over the deposition sources to monitor deposition thickness at a location near the substrate. The crystal mass sensor is calibrated to relate the mass of the material deposited onto the sensor to a layer thickness on the device substrate. This technique, however, has the disadvantage that the crystal mass sensor will have a large film build-up in a high volume mass production environment, which can alter the calibration over time and require frequent changing. Another disadvantage is that the crystal mass sensor is located outside the area of the device and therefore must be calibrated to relate to the deposition on the substrate that is in a physically different location. In some deposition systems, such a those which are constructed with a thermal evaporation source, the uniformity of the deposition in the chamber can vary over time, such as when the amount of organic material in the source is depleted. Therefore, this technique has the inherent disadvantage of not being able to measure the actual films being deposited on the substrate.

Another method of monitoring the layer thickness proposed in U.S. Pat. No. 6,513,451 is to use an optical measurement system such as an interferometer or spectrophotometer to measure the thickness on a moving member which is in the path of the deposition. The moving member can be, for example, a disc which is rotated or indexed so that the surface is also refreshed to avoid layer build up or to permit the measurement of an individual layer. The member can also be cleaned to permit for improved uptime. This method, however, still has the problem that the measurement device is outside the area of the substrate and requires cross calibration that can vary over time. Inaccuracy of the calibration can result in the thickness of the film being different in the target that might result in sub-optimal device characteristics or manufacturing yield loss. Device characteristics, which might suffer from the film being deposited off target include, for example, emission color, efficiency, and device lifetime.

SUMMARY OF THE INVENTION

It is an object of the present invention to provide a new way of measuring the thin film layers deposited on the OLED device substrate.

It is another object of the present invention to improve control of the deposition process for the thin film, thereby reducing the occurrence of devices having sub-optimal device characteristics or improving manufacturing yield loss.

These objects are achieved by a method for making an OLED device, comprising:

a) providing a substrate having one or more test regions and one or more device regions;

b) moving the substrate into a least one deposition chamber for deposition of at least one organic layer;

c) depositing the at least one organic layer through a shadowmask selectively onto the at least one device region and at least one test region on the substrate;

d) measuring a property of the at least one organic layer in the at least one test region; and e) adjusting the deposition process in accordance with the measured property.

BRIEF DESCRIPTION OF THE DRAWINGS

FIGS. 3A to 3E depict shadowmasks for use in depositing the organic layers according to the present invention;

DETAILED DESCRIPTION OF THE INVENTION

An OLED device is constructed by sandwiching two or more organic layers between a first and second electrode. In a passive matrix device, the first electrode is supplied on the device substrate forming laterally spaced rows. Alternately, in an active matrix device, thin film transistors, capacitors, and electrode lines are formed over the substrate and first electrode connections are formed on the substrate and are electrically connected to the active matrix circuitry.

Two or more organic layers are formed over the first electrode. For example, the OLED can be formed by first depositing a hole-transporting layer, then an emission layer, and finally an electron-transporting layer. The organic layers are typically deposited by using evaporation sources where the organic materials are heated such that vapor is produced and deposited on the substrate. The layers are typically deposited in vacuum chambers. Shadowmasks are used to control where on the substrates the organic layers are deposited. For example, the organic layers can be deposited over the emission regions and blocked over areas where the electrical connections are made to the device or where the device is sealed to an encapsulating member. In multicolor devices, different organic layers and materials can be used for each differently colored emission region. In this case, shadowmasks can be used to form separate OLED emission regions for each color. In such a device, either all the layers can differ from each color, or only the emission layer might differ such as is described in U.S. Pat. No. 6,281,634.

Each layer is deposited preferably in a separate vacuum chamber or in a separate shielded area of a single large vacuum chamber. Vacuum is preferable as many of the OLED materials are known to degrade in the presence of moisture or oxygen. The vacuum pressure is preferably maintained at less than 0.1 Pa and more preferably less than 0.001 Pa. This permits for all deposition sources to be used in parallel, increasing manufacturing throughput. Each layer is also preferably deposited with a separate shadowmask.

Figure 1:
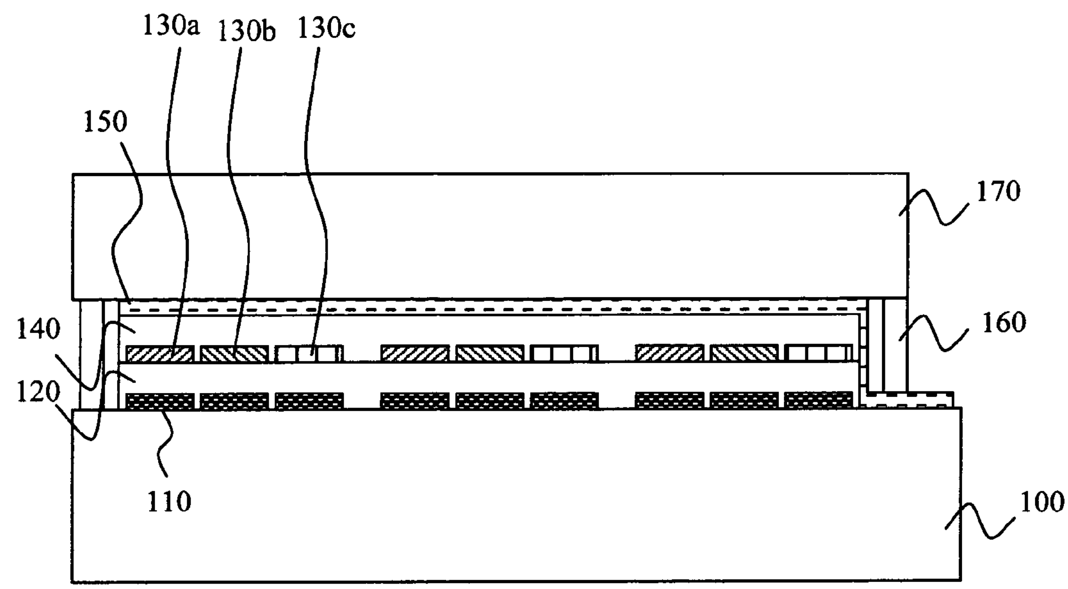
FIG. 1 depicts a cross section of a three-color OLED device.

FIG. 1 shows a cross section of an example three-color red, green, and blue OLED device. The OLED device is constructed with a substrate 100, a first electrode 110, a hole-transporting layer (HTL) 120, a red emitting layer (EML-1) 130*a*, a green emitting layer (EML-2) 130*b*, a blue emitting layer (EML-3) 130*c*, an electron-transporting layer (ETL) 140, a second electrode 150, a seal 160, and an encapsulating member 170. The OLED device described in FIG. 1 is an example OLED configuration, however, many other OLED devices which have multiple emitting layers, hole injection layers, electron injection layers, four color pixels, or other modifications are known in the art and can be successfully practiced using the present invention.

Figure 2:
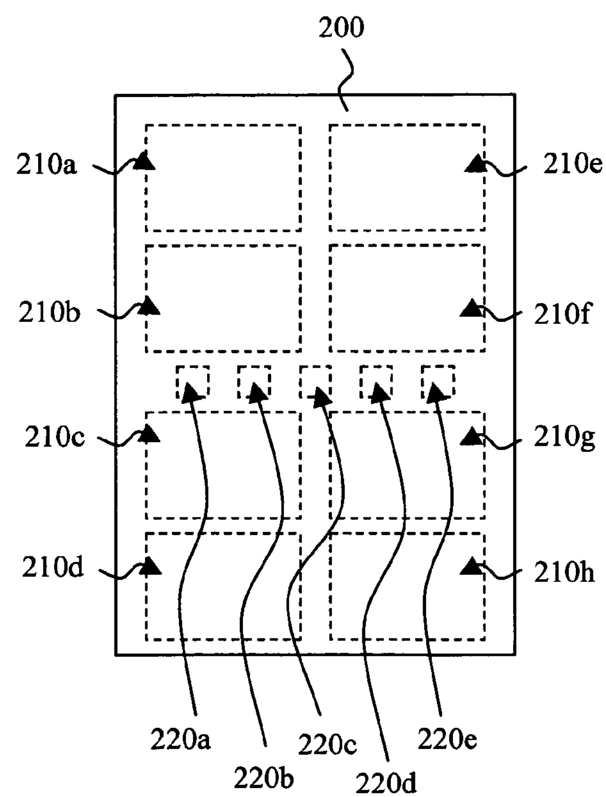
FIG. 2 depicts the top-side layout of an OLED substrate having a plurality of OLED devices.

FIG. 2 shows the top-side layout of a substrate 200 constructed with eight devices regions 210*a*, 210*b*, 210*c*, 210*d*, 210*e*, 210*f*, 210*g*, and 210*h*. These device regions can be separated by, for example, scribing or dicing, to form separate OLED devices such as shown in FIG. 1. Substrate 200 also has test regions 220*a*, 220*b*, 220*c*, 220*d*, and 220*e*.

FIGS. 3*a* through 3*e* show shadowmasks for use in depositing the organic layers according to the present invention for the OLED device shown in FIG. 1. These figures show an example embodiment where eight OLED devices are made on the same substrates. However, the number of OLED devices per substrate can vary.

FIG. 3*a* shows a first shadowmask 10*a* for use in depositing the first organic layer, which in this embodiment is the hole-transporting layer (HTL). Shadowmask 10*a* has openings such as opening 20*a* for depositing the hole-transporting layer in the device regions. Shadowmask 10*a* also has a test opening 30*a* for use in depositing the hole-transporting layer in a test region.

FIG. 3*b* shows second shadowmask 10*b* for use in depositing the second organic layer, which in this embodiment is the red emitting layer (EML-1). Shadowmask 10*b* has openings such as opening 20*b* for depositing the red emitting layer in the device regions. Shadowmask 10*b* also has a test opening 30*b* for use in depositing the red emitting layer in a test region. The test region that is open to shadowmask 10*b* via test opening 30*b* is a different test region than that which is open to shadowmask 10*a* via test opening 30*a*. This permits each different organic layer to be deposited in its own test region.

FIG. 3*c* shows third shadowmask 10*c* for use in depositing the third organic layer, which in this embodiment is the green emitting layer (EML-2). Shadowmask 10*c* has openings such as opening 20*c* for depositing the green emitting layer in the device regions. Shadowmask 10*c* also has a test opening 30*c* for use in depositing the green emitting layer in a test region. The test region that is open to shadowmask 10*c* via test opening 30*c* is a different test region than that which is open to the other shadowmasks for the other organic layers.

Figure 3D:
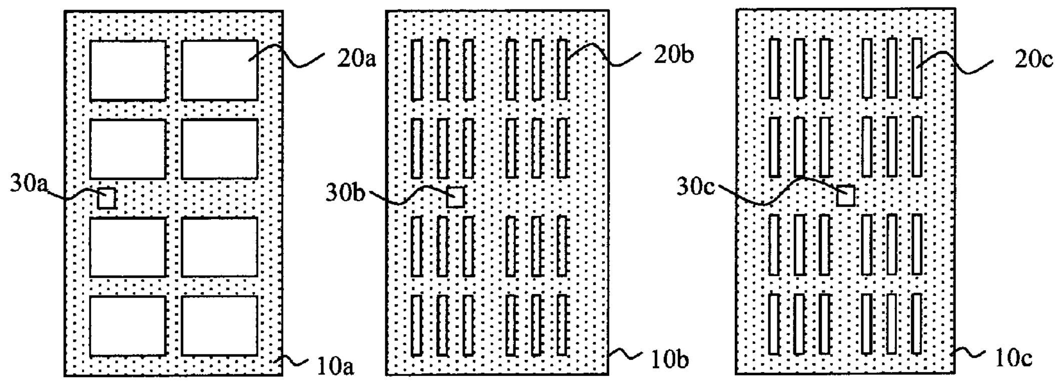
Figure 3D:
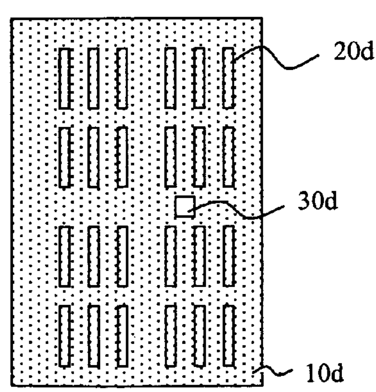

FIG. 3*d* shows fourth shadowmask 10*d* for use in depositing the fourth organic layer, which in this embodiment is the blue emitting layer (EML-3). Shadowmask 10*d* has openings such as opening 20*d* for depositing the blue emitting layer in the device regions. Shadowmask 10*d* also has an opening 30*d* for use in depositing the green emitting layer in a test region. The test region that is open to shadowmask 10*d* via opening 30*d* is a different test region than that which is open to the other shadowmasks for the other organic layers.

Figure 3E:
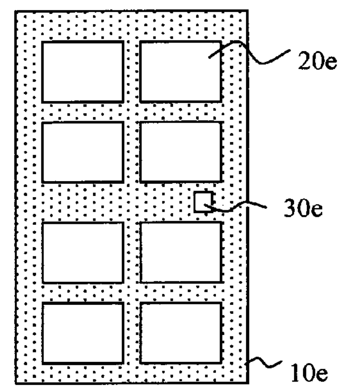

FIG. 3*e* shows fifth shadowmask 10*e* for use in depositing the fourth organic layer, which in this embodiment is the electron-transporting layer (ETL) (EML-3). Shadowmask 10*e* has openings such as opening 20*e* for depositing the electron-transporting layer in the device regions. Shadowmask 10*e* also has a test opening 30*e* for use in depositing the green emitting layer in a test region. The test region that is open to shadowmask 10*e* via test opening 30*e* is a different test region than that which is open to the other shadowmasks for the other organic layers.

While only a single test region is shown for each layer, multiple test regions spaced about the substrate could be provided to permit for measurements of uniformity across the substrate. Also, while the above embodiment shows that each layer has its own separate test region, sites where multiple layers are deposited in the same test region can also be provided to determine multiple layer stack measurements. While the above embodiment shows a test region for each layer, other embodiments where one or more layers are not measured using test regions are also possible.

Figure 4:
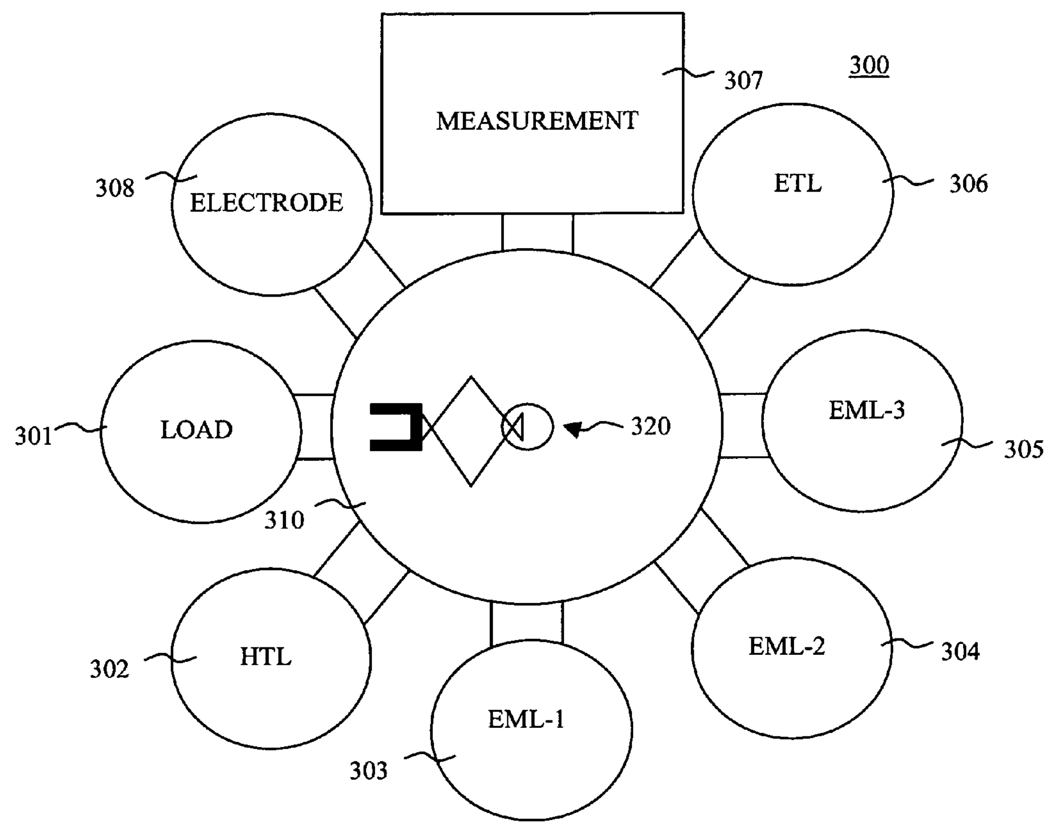
FIG. 4 depicts a manufacturing system useful for fabricating the OLED devices according to the present invention.

FIG. 4 shows a manufacturing system 300 useful for fabricating the OLED device described above. The manufacturing system is composed of several controlled environment chambers such as a loading chamber 301, a HTL deposition chamber 302, an EML-1 deposition chamber 303, an EML-2 deposition chamber 304, an EML-3 deposition chamber 305, an ETL deposition chamber 306, a measurement chamber 307, and an electrode deposition chamber 308. These chambers are connected to a central chamber 310 and are shuttled from chamber to chamber by use of a transferring robot 320. These chambers are control to reduce moisture or oxygen, which are known to degrade OLED devices. This can be achieved, for example, by reducing the pressure of the chambers to <0.1 Pa, or more preferably <0.001 Pa through the use of vacuum pumps. Alternately, some chambers can be maintained in controlled environments of non-reactive gasses such as Ar or N. Other chambers can also be attached to this cluster for performing such tasks as substrate cleaning, device encapsulation, or the deposition of additional layers. Alternately, the above chambers and other additional functions can be split into multiple clusters and the substrates could be transferred between these clusters. The substrates are loaded into the cluster via the load chamber 301. The load chamber 301 can be configured to hold a single substrate or a plurality of substrates. When the substrates are completed through all the processes in the cluster, the substrates can be removed through the load chamber 301. Alternately an additional chamber, such as an un-load chamber, could be added to the cluster to improve the throughput of this task. The measurement chamber 307 is a chamber to which the substrate can be transferred in the controlled environment, where the organic layers that are deposited in the test region can be measured.

Figure 5:
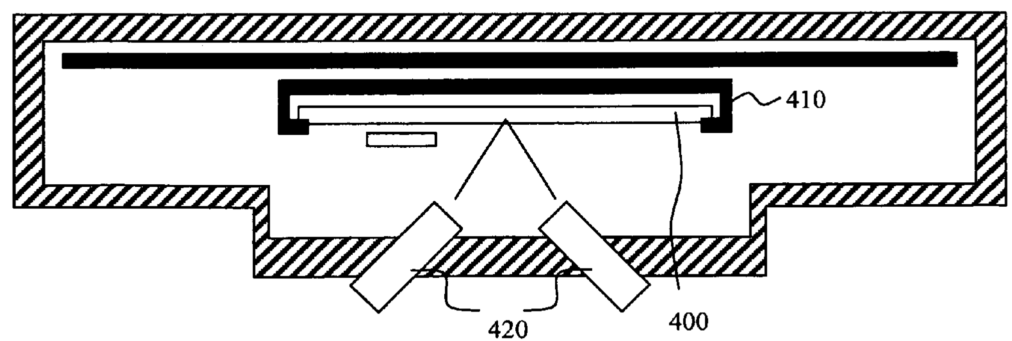
FIG. 5 depicts a simplified cross sectional view of the measurement chamber of the manufacturing system.

FIG. 5 illustrates a simplified cross sectional view of the measurement chamber. The measurement chamber is composed of a substrate holder 410 which holds substrate 400. The substrate holder 410 is capable of moving in the plane of the substrate. Attached to the measurement chamber is a measurement system 420. Measurement system 420 can be composed of one or more measurement devices such as an ellipsometer, an interferometer, a reflectometer, a spectrophotometer, an optical spectrometer, or a luminescent type measurement system. An example of a luminescent type measurement system is the fluorescence measurement technique described in U.S. patent application Publication 2003/0193672 A1. While the measurement system is shown as being incorporated into the walls of the chamber, the measurement system could alternately be located entirely outside the chamber, and the measurement could be conducted remotely through windows in the chamber wall or via fiber optic cables that pass through the chamber walls. The measurement system is also shown as being pointed directly at the measurement area on the substrate, however, alternate configurations which utilize mirrors or other optical elements could be used to permit for non-line-of-sight arrangements. Also, the measurement system can include components such as a computer for data analysis that are outside the chamber but connected to the measurement system.

The measurement system shown in FIG. 5 illustrates an embodiment where the substrate is held above the measurement source, however, alternate embodiments where the substrate is below the measurement system and is resting on, for example, an X-Y stage are also possible. FIG. 5 also shows the substrate as moving, however, the measurement system can also be made to move which would permit the substrate to be in a fixed position. Alternately, another embodiment, where both the substrate and the measurement system move, is also possible.

While the thickness is the most common property that can be measured in the test region as described above, properties other than thickness can also be measured using measurement tools and techniques known in the art. Such properties include, for example, chemical composition, dopant concentration, or optical properties such as absorption, transmission, or refractive index.

Figure 6:
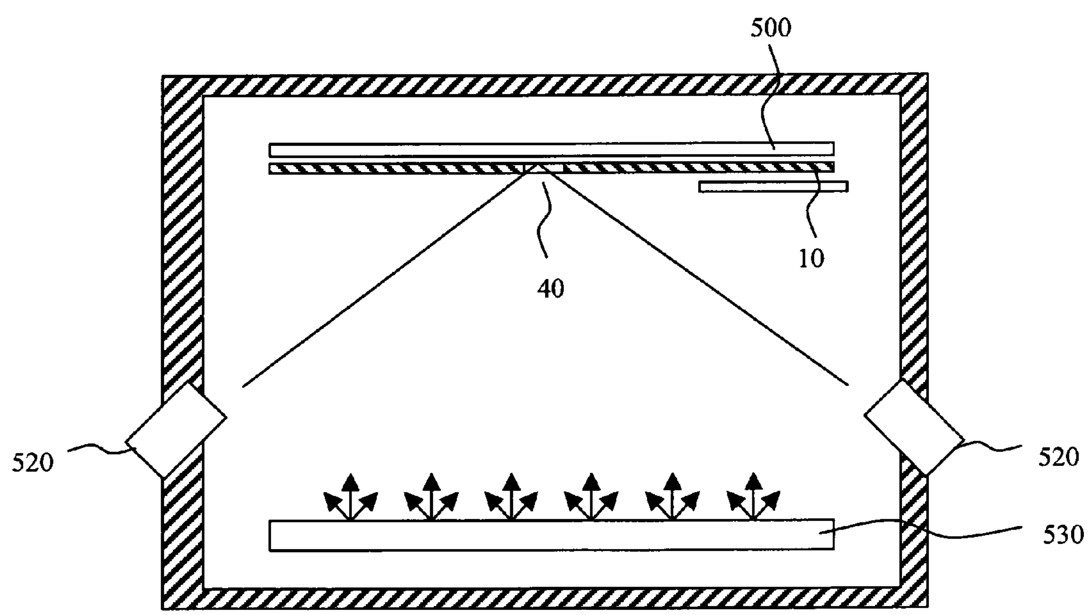
FIG. 6 depicts a simplified cross section view of the material deposition chamber having a measurement system useful for fabricating the OLED devices according to the present invention.

FIG. 6 shows a cross-sectional view of an organic material deposition chamber of an alternate manufacturing system having a measurement system 520 and at least one deposition source 530 in the same chamber. The deposition source could be any of a large variety of deposition sources known in the art, such as, for example, a point source such as a crucible, a linear deposition source, or a shower-head style source. A substrate 500 and a shadowmask 10 which has a test opening 40 located relative to a test region of the substrate are held in place in the chamber by mechanical means (not shown) and can optionally be aligned by an alignment system (not shown) as known in the art.

Using the example of the shadowmasks 10*a*, 10*b*, 10*c*, 10*d*, and 10*e* and manufacturing system 300 having a measurement chamber as described above, a first method for manufacturing an OLED device will be described. First, one or more OLED substrates are loaded into manufacturing system by, for example, the loading chamber 301. The substrate already has deposited on it the first electrode and any optional active matrix circuitry located in device regions of the substrate. The substrate further includes test regions which will correspond to the test openings in the shadowmasks used for the organic depositions. The substrate is then moved into the HTL deposition chamber 302, where the hole-transporting layer is deposited using shadowmask 10*a* to control the regions on the substrate where the organic material is deposited. The hole-transporting layer is deposited onto the substrate in the device regions and the at least one test region as defined by the openings such as opening 20*a* and test opening 30*a*, respectively. A conventional control system, such as a crystal mass sensor device, is used to control the properties, such as film thickness, of the layer. The substrate is then moved into the EML-1 deposition chamber 303. If the loading chamber 301 is configured to hold a plurality of substrates, after the first substrate is moved out of the HTL deposition chamber, a second substrate can be moved into the HTL deposition chamber so that multiple substrates are fabricated in parallel, thereby improving throughput. In the EML-1 deposition chamber 303, the red emitting layer is deposited using shadowmask 10*b* to control the regions on the substrate where the organic material is deposited. The red emitting layer is deposited onto the substrate in a portion of the device regions and the at least one test region as defined by the openings such as opening 20*b* and test opening 30*b*, respectively. A conventional control system, such as a crystal mass sensor device, is used to control the properties, such as film thickness, of the layer. The substrate is then moved into the EML-2 deposition 304 chamber where the green emitting layer is deposited using shadowmask 10*c* to control the regions on the substrate where the organic material is deposited. The green emitting layer is deposited onto the substrate in a portion of the device regions and the at least one test region as defined by the openings such as opening 20*c* and test opening 30*c*, respectively. A conventional control system, such as a crystal mass sensor device, is used to control the properties, such as film thickness, of the layer. The substrate is then moved into the EML-3 deposition 305 chamber where the blue emitting layer is deposited using shadowmask 10*d* to control the regions on the substrate where the organic material is deposited. The blue emitting layer is deposited onto the substrate in a portion of the device regions and the at least one test region as defined by the openings such as opening 20*d* and test opening 30*d*, respectively.

A conventional control system, such as a crystal mass sensor device, is used to control the properties, such as film thickness, of the layer. The substrate is then moved into the ETL deposition 306 chamber where the electron-transporting layer is deposited using shadowmask 10*e* to control the regions on the substrate where the organic material is deposited. The electron-transporting layer is deposited onto the substrate in the device regions and the at least one test region as defined by the openings such as opening 20*e* and test opening 30*e*, respectively. A conventional control system, such as a crystal mass sensor device, is used to control the properties, such as film thickness, of the layer. The substrate is then moved into the measurement chamber 307 where the measurements of the layers are taken on each of the test regions. The information on the measured properties of each of the layers, such as film thickness, are fed back into the control systems of the respective layers to adjust the calibration of the control system. The device is then moved into the electrode deposition chamber 308 where the second electrode is applied to the device. Alternately, the electrode can be applied prior to measurement if the electrode chamber uses a shadowmask that prevents electrode material from depositing on the test regions. The device is then returned to the loading chamber 301 where it can be unloaded or transferred to another system for additional processing such as, for example, encapsulation.

Using the example of the shadowmasks 10*a*, 10*b*, 10*c*, 10*d*, and 10*e* and manufacturing system 300 having a measurement chamber as described above, a second method for manufacturing an OLED device will be described. First, one or more OLED substrates are loaded into the manufacturing system by, for example, the loading chamber 301. The substrate already has deposited on it the first electrode and any optional active matrix circuitry. The substrate is then moved into the HTL deposition chamber 302 where the hole-transporting layer is deposited using shadowmask 10*a* to control the regions on the substrate where the organic material is deposited. A conventional control system, such as a crystal mass sensor device, is used to control the properties, such as film thickness, of the layer. The substrate is then moved into the measurement chamber 307. If the loading chamber 301 is configured to hold a plurality of substrates, after the first substrate is moved out of the HTL deposition chamber, a second substrate can be moved into the HTL deposition chamber so that multiple substrates are fabricated in parallel, thereby improving throughput. In measurement chamber 307, measurements of the hole-transporting layer are taken in the corresponding test region. The information on the measured properties, such as film thickness, is fed back into the control systems of the HTL deposition chamber 302 to adjust the calibration of the control system.

The substrate is then moved into the EML-1 deposition chamber 303 where the red emitting layer is deposited using shadowmask 10*b* to control the regions on the substrate where the organic material is deposited. A conventional control system, such as a crystal mass sensor device, is used to control the properties, such as film thickness, of the layer. The substrate is then moved into the measurement chamber 307 where measurements of the red emitting layer are taken in the corresponding test region. The information on the measured properties, such as film thickness, is fed back into the control systems of the EML-1 deposition chamber 303 to adjust the calibration of the control system.

The substrate is then moved into the EML-2 deposition chamber 304 where the green emitting layer is deposited using shadowmask 10*c* to control the regions on the substrate where the organic material is deposited. A conventional control system, such as a crystal mass sensor device, is used to control the properties, such as film thickness, of the layer. The substrate is then moved into the measurement chamber 307 where measurements of the green emitting layer are taken in the corresponding test region. The information on the measured properties, such as film thickness, is fed back into the control systems of the EML-2 deposition chamber 304 to adjust the calibration of the control system.

The substrate is then moved into the EML-3 deposition 305 chamber where the blue emitting layer is deposited using shadowmask 10*d* to control the regions on the substrate where the organic material is deposited. A conventional control system, such as a crystal mass sensor device, is used to control the properties, such as film thickness, of the layer. The substrate is then moved into the measurement chamber 307 where measurements of the blue emitting layer are taken in the corresponding test region. The information on the measured properties, such as film thickness, is fed back into the control systems of the EML-3 deposition chamber 305 to adjust the calibration of the control system.

The substrate is then moved into the ETL deposition chamber 306 where the electron-transporting layer is deposited using shadowmask 10*e* to control the regions on the substrate where the organic material is deposited. A conventional control system, such as a crystal mass sensor device, is used to control the properties, such as film thickness, of the layer. The substrate is then moved into the measurement chamber 307 where measurements of the electron-transporting layer are taken in the corresponding test region. The information on the measured properties, such as film thickness, is fed back into the control systems of the ETL deposition chamber 306 to adjust the calibration of the control system.

The device is then moved into the electrode deposition chamber 308 where the second electrode is applied to the device. The device is then returned to the loading chamber 301 where it can be unloaded or transferred to another system for additional processing such as, for example, encapsulation. The second method has the advantage over the first method that measurement information is produced more quickly and the feed back to the control system is achieved in a shorter amount of time. However, because the second method requires more movements of the substrate, throughput can be reduced. Alternate embodiments of the above methods where two or more sequential layers are deposited between movements to the measurement chamber can also be practiced.

The invention has been described in detail with particular reference to certain preferred embodiments thereof, but it will be understood that variations and modifications can be effected within the spirit and scope of the invention.

PARTS LIST

10 shadowmask
10*a* shadowmask
10*b* shadowmask
10*c* shadowmask
10*d* shadowmask
10*e* shadowmask
20*a* opening
20*b* opening
20*c* opening
20*d* opening
20*e* opening
30*a* test opening
30*b* test opening
30*c* test opening
30*d* test opening
30*e* test opening
40 test opening
100 substrate
110 first electrode
120 hole-transporting layer
130*a* red emitting layer
130*b* green emitting layer
130*c* blue emitting layer
140 electron-transporting layer
150 second electrode
160 seal
170 encapsulating member
200 substrate
210*a* device region

210*b* device region
210*c* device region
210*d* device region
210*e* device region
210*f* device region
210*g* device region
210*h* device region
220*a* test region
220*b* test region
220*c* test region
220*d* test region
220*e* test region
300 manufacturing system
301 loading chamber
302 HTL deposition chamber
303 EML-1 deposition chamber
304 EML-2 deposition chamber
305 EML-3 deposition chamber
306 ETL deposition chamber
307 measurement chamber
308 electrode deposition chamber
310 central chamber
320 transferring robot
400 substrate
410 substrate holder
420 measurement system
500 substrate
520 measurement system
530 deposition source

The invention claimed is:

1. A method for making an OLED device having a plurality of organic layers, comprising:

a) providing a substrate having a plurality of test regions and one or more device regions wherein the plurality of test regions are spaced apart from the one or more device region;

b) moving the substrate sequentially into first and second deposition chambers for respectively depositing first and second different organic layers of the OLED device in each deposition chamber;

c) depositing the first organic layer in the first deposition chamber onto a device region through a first opening in a first shadowmask and onto a first test region through a second opening in the first shadowmask and depositing the second organic layer onto the device region through a first opening in a second shadowmask and onto a second test region through a second opening in the second shadowmask wherein the first test region is spaced apart from the second test region;

d) measuring a property of each organic layer in the first and second test regions; and e) adjusting the deposition process of either the first or second organic layer or both in accordance with the measured property.

2. The method according to claim 1 wherein the measuring occurs in the first or second deposition chambers or both.

3. The method according to claim 1 wherein the properties include thickness of the organic layers and the adjusting step adjusts the deposition towards a target thickness.

4. The method according to claim 1 wherein the properties include dopant concentration, chemical composition, or optical properties or combinations thereof.

5. The method according to claim 1 further including the step of moving the substrate from the first or second deposition chamber into a measurement chamber where the property is measured.

6. The method according to claim 1 wherein measurement of the properties in the first and second test regions is done after the organic layers of the first and second test regions are deposited or after each organic layer of each test region is deposited.

7. The method according to claim 1 where the substrate is kept at a reduced vacuum pressure during deposition and measurement.

8. The method according to claim 7 where the pressure of the vacuum is less than 0.1 Pa.

9. The method according to claim 7 where the pressure of the vacuum is less than 0.001 Pa.

10. The method according to claim 1 wherein the first and second shadowmasks each include a plurality of openings corresponding to a plurality of different device regions.

* * * * *